(12) United States Patent
Takeuchi et al.

(10) Patent No.: US 8,791,214 B2
(45) Date of Patent: Jul. 29, 2014

(54) ACTIVE ESTER RESIN, METHOD FOR PRODUCING THE SAME, THERMOSETTING RESIN COMPOSITION, CURED PRODUCT OF THE THERMOSETTING RESIN COMPOSITION, SEMICONDUCTOR ENCAPSULATING MATERIAL, PRE-PREG, CIRCUIT BOARD, AND BUILD-UP FILM

(75) Inventors: Kan Takeuchi, Ichihara (JP); Etsuko Suzuki, Ichihara (JP); Kunihiro Morinaga, Ichihara (JP); Kazuo Arita, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/824,821

(22) PCT Filed: May 25, 2012

(86) PCT No.: PCT/JP2012/063443
§ 371 (c)(1),
(2), (4) Date: Jun. 7, 2013

(87) PCT Pub. No.: WO2012/165317
PCT Pub. Date: Dec. 6, 2012

(65) Prior Publication Data
US 2014/0151094 A1  Jun. 5, 2014

(30) Foreign Application Priority Data

May 27, 2011  (JP) ................................ 2011-119080

(51) Int. Cl.
*B32B 15/092* (2006.01)
*B32B 27/04* (2006.01)
*C08G 8/32* (2006.01)
*C08L 61/14* (2006.01)
*C08L 63/00* (2006.01)

(52) U.S. Cl.
USPC .......... 525/481; 428/365; 428/418; 528/146; 528/147; 528/153; 528/161

(58) Field of Classification Search
None
See application file for complete search history.

(56) References Cited

U.S. PATENT DOCUMENTS

| 5,756,564 | A  | * | 5/1998  | Murata et al.   | 523/466 |
| 8,669,333 | B2 | * | 3/2014  | Arita et al.    | 525/523 |
| 2011/0120761 | A1 | * | 5/2011  | Kawai        | 174/258 |
| 2011/0139496 | A1 | * | 6/2011  | Nakamura     | 174/256 |

FOREIGN PATENT DOCUMENTS

| JP | 55-043147 | A | 3/1980 |
| JP | 61-241314 | A | 10/1986 |
| JP | 61-264014 | A | 11/1986 |
| JP | 61-287919 | A | 12/1986 |
| JP | 04-353519 | A | 12/1992 |
| JP | 05-005030 | A | 1/1993 |
| JP | 07-025962 | A | 1/1995 |
| JP | 07-082348 | A | 3/1995 |
| JP | 09-227646 | A | 9/1997 |
| JP | 10-241680 | A | 9/1998 |

OTHER PUBLICATIONS

International Search Report dated Aug. 7, 2012, issued for PCT/JP2012/063443.

\* cited by examiner

*Primary Examiner* — Robert Sellers
(74) *Attorney, Agent, or Firm* — Edwards Wildman Palmer LLP (57) ABSTRACT

A low dielectric constant, a low dielectric loss tangent, and heat resistance are achieved. An active ester resin that has a resin structure produced by reacting a polyfunctional phenolic compound (a1) with a monofunctional aromatic carboxylic acid or its chloride (a2) and an aromatic dicarboxylic acid or its chloride (a3). The polyfunctional phenolic compound (a1) is represented by structural formula (1) below:

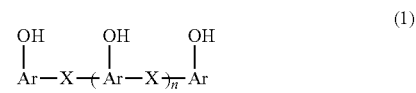

(1)

(where Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms, X represents a methylene group, a divalent cyclic aliphatic hydrocarbon group, a phenylene dimethylene group, or a biphenylene-dimethylene group, and n represents the number of repeating units and the average thereof is in a range of 0.5 to 10).

23 Claims, 1 Drawing Sheet

ACTIVE ESTER RESIN, METHOD FOR PRODUCING THE SAME, THERMOSETTING RESIN COMPOSITION, CURED PRODUCT OF THE THERMOSETTING RESIN COMPOSITION, SEMICONDUCTOR ENCAPSULATING MATERIAL, PRE-PREG, CIRCUIT BOARD, AND BUILD-UP FILM

TECHNICAL FIELD

The present invention relates to a thermosetting resin composition that exhibits excellent flame retardancy, excellent heat resistance, and a low dielectric loss tangent when formed into a cured product and that has excellent solvent solubility, and a cured product of the thermosetting resin composition, an active ester resin added for producing the thermosetting resin composition, a method for producing the active ester resin, and a semiconductor encapsulating material, a pre-preg, a circuit board, and a build-up film that are produced from the thermosetting resin composition.

BACKGROUND ART

Epoxy resin compositions that contain an epoxy resin and a curing agent for the epoxy resin as essential components exhibit excellent heat resistance and insulating property when formed into a cured product, and are thus widely used in electronic components such as semiconductors and multilayer printed circuit boards.

For electronic component usage, in the technical field of multilayer printed circuit board insulating materials, recently, there have been increases in the speed and frequency of signals in various electronic apparatuses. However, it is becoming difficult to achieve a low dielectric loss tangent while maintaining a sufficiently low dielectric constant with these increases in the speed and frequency of signals.

Therefore, it is desired to provide a thermosetting resin composition capable of producing a cured product which exhibits a sufficiently low dielectric loss tangent while maintaining a sufficiently low dielectric constant for signals at higher speeds and higher frequencies. A known technique for providing materials having such a low dielectric constant and such a low dielectric loss tangent uses an active ester compound as a curing agent for epoxy resin, the active ester compound being produced by aryl-esterifying phenolic hydroxyl groups of phenol novolac resin (see Patent Literature 1 below).

However, although multilayer printed circuit board insulating materials have been anticipated to have extremely high heat resistance due to the tendency for electronic components to have higher frequencies and smaller sizes, the active ester compound produced by aryl-esterifying phenolic hydroxyl groups of phenol novolac resin causes a decrease in the crosslink density of a cured product due to introduction of the aryl ester structure, which results in the insufficient heat resistance of the cured product. Thus, it is difficult to achieve heat resistance while achieving a low dielectric constant and a low dielectric loss tangent.

CITATION LIST

Patent Literature

PTL 1: Japanese Unexamined Patent Application Publication No. 7-82348

SUMMARY OF INVENTION

Technical Problem

Accordingly, an object of the present invention is to provide a thermosetting resin composition that exhibits excellent heat resistance while maintaining a low dielectric constant and a low dielectric loss tangent when formed into a cured product, a cured product of the thermosetting resin composition, an active ester resin that imparts these properties to the cured product, a method for producing the active ester resin, and a semiconductor encapsulating material, a pre-preg, a circuit board, and a build-up film produced from the composition.

Solution to Problem

The inventors of the present invention have conducted extensive studies to achieve the object and found that an active ester resin produced by aryl-esterifying a polyfunctional phenol resin in such a manner that some of the phenolic hydroxyl groups of the polyfunctional phenol resin remain and crosslinking the backbone portion of the polyfunctional phenol resin by reacting the remaining phenolic hydroxyl groups with a polyvalent aromatic carboxylic acid or its chloride, the active ester resin serving as a curing agent for epoxy resin, exhibits excellent heat resistance when formed into a cured product while maintaining a low dielectric constant and a low dielectric loss tangent. Thus, the present invention has been made.

Specifically, the present invention relates to a active ester resin that has a resin structure produced by reacting a polyfunctional phenolic compound (a1) with a monofunctional aromatic carboxylic acid or its chloride (a2) and an aromatic dicarboxylic acid or its chloride (a3) in such a manner that an amount of the monofunctional aromatic carboxylic acid or its chloride (a2) is 0.46 to 0.95 moles and an amount of the aromatic dicarboxylic acid or its chloride (a3) is 0.27 to 0.025 moles per mole of phenolic hydroxyl groups of the polyfunctional phenolic compound (a1). The polyfunctional phenolic compound (a1) is represented by structural formula (1) below:

[Chem. 1]

(where Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms; X represents a methylene group, a divalent cyclic aliphatic hydrocarbon group, a phenylene dimethylene group, or a biphenylene-dimethylene group; and n represents the number of repeating units and an average thereof is in a range of 0.5 to 10).

The present invention further relates to a method for producing an active ester resin, the method including reacting a polyfunctional phenolic compound (a1) with a monofunctional aromatic carboxylic acid or its chloride (a2) and an aromatic dicarboxylic acid or its chloride (a3) in such a manner that an amount of the monofunctional aromatic carboxylic acid or its chloride (a2) is 0.46 to 0.95 moles and an amount of the aromatic dicarboxylic acid or its chloride (a3) is 0.27 to 0.025 moles per mole of phenolic hydroxyl groups of the polyfunctional phenolic compound (a1). The polyfunctional phenolic compound (a1) is represented by structural formula (1) below:

[Chem. 2]

(1)

(where Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms; X represents a methylene group, a divalent cyclic aliphatic hydrocarbon group, a phenylene dimethylene group, or a biphenylene-dimethylene group; and n represents the number of repeating units and an average thereof is in a range of 0.5 to 10).

The present invention further relates to a curable resin composition that includes an active ester resin (A) and an epoxy resin (B) as essential components, the active ester resin (A) having a resin structure produced by reacting a polyfunctional phenolic compound (a1) with a monofunctional aromatic carboxylic acid or its chloride (a2) and an aromatic dicarboxylic acid or its chloride (a3) in such a manner that an amount of the monofunctional aromatic carboxylic acid or its chloride (a2) is 0.46 to 0.95 moles and an amount of the aromatic dicarboxylic acid or its chloride (a3) is 0.27 to 0.025 moles per mole of phenolic hydroxyl groups of the polyfunctional phenolic compound (a1). The polyfunctional phenolic compound (a1) is represented by structural formula (1) below:

[Chem. 3]

(1)

(where Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms; X represents a methylene group, a divalent cyclic aliphatic hydrocarbon group, a phenylene dimethylene group, or a biphenylene-dimethylene group; and n represents the number of repeating units and an average thereof is in a range of 0.5 to 10).

The present invention further relates to a cured product produced by curing the thermosetting resin composition.

The present invention further relates to a semiconductor encapsulating material that includes a thermosetting resin composition further containing an inorganic filler (C) in a proportion of 70% to 95% by mass in the composition in addition to the active ester resin (A) and the epoxy resin (B) of the thermosetting resin composition.

The present invention further relates to a pre-preg produced by impregnating a reinforcement substrate with the thermosetting resin composition diluted with an organic solvent and semi-curing the resulting impregnated substrate.

The present invention further relates to a circuit board produced by diluting the thermosetting resin composition with an organic solvent to prepare a varnish, shaping the varnish into a plate, and molding the plate and a copper foil under heat and pressure.

The present invention further relates to a build-up film produced by applying the thermosetting resin composition diluted with an organic solvent to a base film and drying the film.

Advantageous Effects of Invention

The present invention provides a thermosetting resin composition that exhibits excellent heat resistance while maintaining a low dielectric constant and a low dielectric loss tangent when formed into a cured product, a cured product of the thermosetting resin composition, an active ester resin that causes the cured product to exhibit these properties, and a semiconductor encapsulating material, a pre-preg, and a circuit board that are produced from the composition.

DESCRIPTION OF EMBODIMENTS

The present invention is described in detail below.

As described above, an active ester resin according to the present invention has a resin structure produced by reacting a polyfunctional phenolic compound (a1) with a monofunctional aromatic carboxylic acid or its chloride (a2) and an aromatic dicarboxylic acid or its chloride (a3) in such a manner that an amount of the monofunctional aromatic carboxylic acid or its chloride (a2) is 0.46 to 0.95 moles and an amount of the aromatic dicarboxylic acid or its chloride (a3) is 0.27 to 0.025 moles per mole of phenolic hydroxyl groups of the polyfunctional phenolic compound (a1). The polyfunctional phenolic compound (a1) is represented by structural formula (1) below:

[Chem. 4]

(1)

(where Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms; X represents a methylene group, a divalent cyclic aliphatic hydrocarbon group, a phenylene dimethylene group, or a biphenylene-dimethylene group; and n represents the number of repeating units and the average thereof is in a range of 0.5 to 10).

In the present invention, as described above, a polyfunctional phenol resin represented by the structural formula (1) is aryl-esterified by reacting phenolic hydroxyl groups of the polyfunctional phenol resin with the monofunctional aromatic carboxylic acid or its chloride (a2) in such a manner that some of the phenolic hydroxyl groups of the polyfunctional phenol resin remain, and the backbone portion of the resin is crosslinked by reacting the remaining phenolic hydroxyl groups with the polyvalent aromatic dicarboxylic acid or its chloride (a3). As a result, the resin exhibits excellent heat resistance while maintaining a low dielectric constant and a low dielectric loss tangent when formed into a cured product. If the amount of aromatic dicarboxylic acid or its chloride (a3) exceeds 0.27 moles per mole of the phenolic hydroxyl groups of the polyfunctional phenolic compound (a1), excessive crosslinking occurs, which significantly increases the molecular weight, and some of the active groups remain uncrosslinked due to steric hindrance, which is likely to result in the product being undercured. As a result, an effect of improving the dielectric characteristics cannot be obtained, and the thermal expansion property of the cured product is poor. If the amount of aromatic dicarboxylic acid or its chloride (a3) is less than 0.025 moles, an effect of improving the heat resistance of the cured product is reduced due to insufficient crosslinking. If the amount of monofunctional aromatic carboxylic acid or its chloride (a2) is less than 0.46 moles per mole of the phenolic hydroxyl groups of the polyfunctional phenolic compound (a1), an effect of reducing the dielectric constant and the dielectric loss tangent of the cured product is reduced and the thermal expansion property of the cured product is poor. If the amount of monofunctional aromatic carboxylic acid or its chloride (a2) exceeds 0.95 moles, the effect of improving the heat resistance of the cured product is reduced.

The polyfunctional phenolic compound (a1) used is represented by structural formula (1) below.

[Chem. 5]

$$\underset{Ar}{\overset{OH}{|}} - X + \underset{Ar}{\overset{OH}{|}} - X \overset{}{\underset{n}{\rightarrow}} \underset{Ar}{\overset{OH}{|}} \quad (1)$$

In structural formula (1), Ar represents a benzene ring; a naphthalene ring; a benzene ring having an alkyl group having 1 to 4 carbon atoms, such as a benzene ring nuclear-substituted by a methyl group, an ethyl group, a propyl group, or a t-butyl group; or a naphthalene ring having an alkyl group having 1 to 4 carbon atoms, such as a naphthalene ring nuclear-substituted by a methyl group, an ethyl group, a propyl group, or a t-butyl group. X represents a methylene group, a phenylene dimethylene group, a biphenylene-dimethylene group, a divalent cyclic aliphatic hydrocarbon group, an ethylidene group, or 2,2-propylene group.

Examples of the divalent cyclic aliphatic hydrocarbon group include divalent cyclic aliphatic hydrocarbon groups derived from unsaturated cyclic aliphatic hydrocarbon compounds such as dicyclopentadiene, tetrahydroindene, 4-vinylcyclohexene, 5-vinylnorborna-2-ene, α-pinene, β-pinene, and limonene. Among these cyclic aliphatic hydrocarbon groups, a divalent hydrocarbon group derived from dicyclopentadiene is particularly preferable from the viewpoint of heat resistance.

n represents the number of repeating units and the average thereof is preferably in the range of 0.5 to 10 because the cured product exhibits a significant effect of improving heat resistance. The value of n in structural formula (1) above can be determined as follows:

[Method for Determining n in Structural Formulae (1) and (2)]

The ratios ($\beta 1/\alpha 1$, $\beta 2/\alpha 2$, $\beta 3/\alpha 3$, and $\beta 4/\alpha 4$) of theoretical molecular weights ($\beta 1$, $\beta 2$, $\beta 3$, and $\beta 4$) for n=1, n=2, n=3, and n=4, respectively, to molecular weights ($\alpha 1$, $\alpha 2$, $\alpha 3$, and $\alpha 4$) measured by GPC in terms of styrene under the following conditions, which correspond to n=1, n=2, n=3, and n=4, respectively, are calculated and the average of these ratios ($\beta 1/\alpha 1$, $\beta 2/\alpha 2$, $\beta 3/60\ 3$, and $\beta 4/\alpha 4$) is calculated. A number-average molecular weight (Mn) determined by GPC is multiplied by the calculated average to obtain a mean molecular weight. Then, the value of n is calculated by assuming the molecular weight of the compound represented by structural formula (1) is equal to the calculated mean molecular weight.

(GPC Measurement Conditions)

Measurement instrument: "HLC-8220 GPC" produced by Tosoh Corporation

Column: Guardcolumn "$H_{XL}$-L" produced by Tosoh Corporation
+"TSK-GEL G2000HXL" produced by Tosoh Corporation
+"TSK-GEL G2000HXL" produced by Tosoh Corporation
+"TSK-GEL G3000HXL" produced by Tosoh Corporation
+"TSK-GEL G4000HXL" produced by Tosoh Corporation Detector: R1 (differential refractometer)

Data processing: "GPC-8020 model II version 4.10" produced by Tosoh Corporation

Measurement conditions: Column temperature 40° C.
Developing solvent Tetrahydrofuran
Flow rate 1.0 ml/min Standard: In accordance with the measurement manual of "GPC-8020 model II version 4.10", the following monodisperse polystyrenes whose molecular weights are known are used.

(Polystyrenes Used)
"A-500" produced by Tosoh Corporation
"A-1000" produced by Tosoh Corporation
"A-2500" produced by Tosoh Corporation
"A-5000" produced by Tosoh Corporation
"F-1" produced by Tosoh Corporation
"F-2" produced by Tosoh Corporation
"F-4" produced by Tosoh Corporation
"F-10" produced by Tosoh Corporation
"F-20" produced by Tosoh Corporation
"F-40" produced by Tosoh Corporation
"F-80" produced by Tosoh Corporation
"F-128" produced by Tosoh Corporation

Sample: A tetrahydrofuran solution having a resin solid content of 1.0% by mass filtered through a microfilter (50 µl)

When X in general formula (1) is a methylene group, specific examples of the polyfunctional phenolic compound (a1) include novolac phenol resins represented by structural formulae (a1) to (a6) below.

[Chem. 6]

a1

When X in general formula (1) is a phenylene dimethylene group, specific examples of the polyfunctional phenolic compound (a1) include phenol aralkyl resins represented by structural formulae (a7) to (a8) below.

[Chem. 7]

When X in general formula (1) is a biphenylene-dimethylene group, specific examples of the polyfunctional phenolic compound (a1) include biphenyl-based phenol aralkyl resins represented by structural formulae (a9) and (a10) below.

[Chem. 8]

When X in general formula (1) is a divalent cyclic aliphatic hydrocarbon group, specific examples of the polyfunctional phenolic compound (a1) include dicyclopentadiene-type phenol resins represented by structural formulae (a11) to (a12) below.

[Chem. 9]

a11 a12

When X in general formula (1) is an ethylidene group, specific examples of the polyfunctional phenolic compound (a1) include divinylbenzene-type phenol resins represented by structural formulae (a13) below.

[Chem. 10]

a13

When X in general formula (1) is a phenylmethylene group, specific examples of the polyfunctional phenolic compound (a1) include a phenol resin represented by structural formula (a14) below.

[Chem. 11]

a14

When X in general formula (1) is a 2,2-propylene group, specific examples of the polyfunctional phenolic compound (a1) include phenol resins represented by structural formulae (a15) to (a16) below.

[Chem. 12]

a15 a16

In the present invention, among these phenol resins, novolac phenol resin, phenol aralkyl resin, biphenyl-based phenol aralkyl resin, and dicyclopentadiene-type phenol resin are particularly preferable from the viewpoint of heat resistance.

The polyfunctional phenolic compound (a1) preferably has a softening point in the range of 70° C. to 200° C. because the final resulting active ester resin has high solubility in organic solvents and serves as a material suitable for a varnish for circuit board. The polyfunctional phenolic compound (a1) preferably has a hydroxyl equivalent in the range of 100 to 220 g/eq. and particularly in the range of 120 to 220 g/eq., because the resulting active ester resin has an effect of markedly improving dielectric characteristics and moisture resistance after being cured and also has excellent fluidity.

Examples of the monofunctional aromatic carboxylic acid or its chloride (a2) used for the reaction with the polyfunctional phenolic compound (a1) include benzoic acid; alkylbenzoic acids such as phenylbenzoic acid, methylbenzoic acid, ethylbenzoic acid, n-propylbenzoic acid, i-propylbenzoic acid, and t-butylbenzoic acid; and acid halides such as an acid fluoride, an acid chloride, an acid bromide, and an acid iodide of these acids. Benzoyl chloride or alkylbenzoyl chlorides are preferable from the viewpoint of good reactivity with the phenolic hydroxyl groups of the polyfunctional phenolic compound (a1).

Specific examples of the aromatic dicarboxylic acid or its chloride (a3) used for the reaction with the polyfunctional phenolic compound (a1) include phthalic acid, isophthalic acid, terephthalic acid, 2,6-naphthalenedicarboxylic acid, 1,6-naphthalenedicarboxylic acid, 2,7-naphthalenedicarboxylic acid, and acid chlorides thereof. Among these, isophthalic acid chloride and terephthalic acid chloride are particularly preferable from the viewpoint of balance between solvent solubility and heat resistance.

In the present invention, when the polyfunctional phenolic compound (a1) is reacted with the monofunctional aromatic carboxylic acid or its chloride (a2) and the aromatic dicarboxylic acid or its chloride (a3), a monohydric phenolic compound (a-4) may be further reacted in addition to these components if carboxyl groups of the aromatic dicarboxylic acid or its chloride (a3) remain in the resin structure. Examples of the monohydric phenolic compound (a-4) used include phenol, cresol, p-t-butylphenol, 1-naphthol, and 2-naphthol. Among these, phenol, cresol, and 1-naphthol are preferable from the viewpoint of good reactivity with carboxyl groups and acid anhydride groups.

As described above, the active ester resin can be produced by methods 1 to 3 below.

Method 1: a method of reacting the polyfunctional phenolic compound (a1) with the aromatic dicarboxylic acid or its chloride (a3) and the monofunctional aromatic carboxylic acid or its chloride (a2).

Method 2: a method of reacting the polyfunctional phenolic compound (a1) with the monofunctional aromatic carboxylic acid or its chloride (a2) and then reacting the reaction product with the aromatic dicarboxylic acid or its chloride (a3).

A specific example of method 1 is a method of reacting the polyfunctional phenolic compound (a1) with the aromatic dicarboxylic acid or its chloride (a2) and the monofunctional aromatic carboxylic acid or its chloride (a3) in the presence of a basic catalyst, wherein, as described above, the reaction ratio is such that the amount of monofunctional aromatic carboxylic acid or its chloride (a2) is 0.46 to 0.95 moles and the amount of aromatic dicarboxylic acid or its chloride (a3) is 0.27 to 0.025 moles per mole of the phenolic hydroxyl groups of the polyfunctional phenolic compound (a1).

A specific example of method 2 is a method of reacting the polyfunctional phenolic compound (a1) with the monofunctional aromatic carboxylic acid or its chloride (a3) in such a manner that an amount of monofunctional aromatic carboxylic acid or its chloride (a2) is 0.46 to 0.95 moles per mole of the phenolic hydroxyl groups of the polyfunctional phenolic compound (a1) in the presence of a basic catalyst and then reacting the resulting intermediate with the aromatic dicarboxylic acid or its chloride (a3) in such a manner that an amount of aromatic dicarboxylic acid or its chloride (a3) is 0.27 to 0.025 moles per mole of the phenolic hydroxyl groups of the polyfunctional phenolic compound (a1) in the presence of a basic catalyst.

Examples of the alkali catalyst that can be used in methods 1 and 2 include sodium hydroxide, potassium hydroxide, triethylamine, and pyridine. Among these alkali catalysts, sodium hydroxide and potassium hydroxide are particularly preferable because they can be used in the form of an aqueous solution and productivity is improved.

In the reactions by methods 1 and 2, each of the raw material components is preferably dissolved in an organic solvent and subjected to the reaction. Examples of the organic solvent used include toluene and dichloromethane.

Between methods 1 and 2, method 1 is particularly preferable from the viewpoint of the excellent heat resistance of the resulting active ester resin, and method 2 is particularly preferable from the viewpoint of ease of control of the degree of crosslinking of the active ester resin.

The active ester resin produced as described above preferably has a softening point of 70° C. to 140° C. from the viewpoint of high solubility in organic solvents so that it may suitably be used as a varnish for circuit board, and from the viewpoint of excellent heat resistance when formed into a cured product because the crosslink density increases during curing.

When the concentration of functional groups in the active ester resin is excessively decreased, the active ester resin has poor curability and the crosslink density of the cured product is decreased, which reduces an effect of improving heat resistance after being cured. Therefore, the active ester resin preferably has carbonyloxy groups that constitute the ester in a proportion of 180 to 400 g/eq.

A curable resin composition according to the present invention, which includes an active ester resin (A) and an epoxy resin (B) as essential components, uses the active ester resin according to the present invention described above as the active ester resin (A).

Various epoxy resins can be used as the epoxy resin (B) added to the thermosetting resin composition according to the present invention. Examples of the epoxy resins include bisphenol epoxy resins such as bisphenol A epoxy resins and bisphenol F epoxy resins; biphenyl epoxy resins such as biphenyl epoxy resins and tetramethylbiphenyl epoxy resins; novolac epoxy resins such as phenol novolac epoxy resins, cresol novolac epoxy resins, bisphenol A novolac epoxy resins, epoxidized compounds of a condensation product between a phenol and an aromatic aldehyde that has a phenolic hydroxyl group, and biphenyl novolac epoxy resins; triphenylmethane epoxy resins; tetraphenylethane epoxy resin; dicyclopentadiene-phenol addition reaction-type epoxy resins represented by structural formula below:

[Chem. 13]

(where G represents a glycidyl group and k represents the number of repeating units and is an integer of 0 to 20); phenol aralkyl-type epoxy resins represented by structural formula below:

[Chem. 14]

(where G represents a glycidyl group and k represents the number of repeating units and is an integer of 0 to 20); biphenyl-based phenol aralkyl-type epoxy resins represented by structural formula below:

[Chem. 15]

(where G represents a glycidyl group and k represents the number of repeating units and is an integer of 0 to 20); epoxy resins that have a naphthalene skeleton in their molecular structure, such as naphthol novolac epoxy resins, naphthol aralkyl-type epoxy resins, naphthol-phenol co-condensed novolac epoxy resins, naphthol-cresol co-condensed novolac epoxy resins, diglycidyloxynaphthalene, 1,1-bis(2,7-diglycidyloxy-1-naphthyl)alkanes, and carbonyl-group-containing naphthalene-based epoxy resins represented by structural formula below; and phosphorus-atom-containing epoxy resins.

[Chem. 16]

These epoxy resins may be used alone or in combination of two or more.

Examples of the phosphorus-atom-containing epoxy resins include epoxidized compounds of 9,10-dihydro-9-oxa-10-phosphaphenanthrene-10-oxide (hereafter, abbreviated as "HCA"), epoxidized compounds of phenol resins produced by reacting HCA with quinones, HCA-modified phenol novolac epoxy resins, HCA-modified cresol novolac epoxy resins, bisphenol A epoxy resins modified with phenol resins produced by reacting HCA with quinones, and bisphenol A epoxy resins modified with phenol resins produced by reacting HCA with quinones.

Among these epoxy resins (A), from the viewpoint of heat resistance, dicyclopentadiene-phenol addition reaction-type epoxy resins, epoxy resins that have naphthalene skeletons in their molecular structures, and epoxy resins that have phosphorus atoms in their molecular structures are particularly preferable. From the viewpoint of solvent solubility, bisphenol epoxy resins and novolac epoxy resins are particularly preferable.

With respect to the blending amounts of the active ester resin (A) and the epoxy resin (B) in the thermosetting resin composition according to the present invention, the proportion of epoxy groups in the epoxy resin (B) is 0.8 to 1.2 equivalents per equivalent of carbonyloxy groups constituting ester in the active ester resin (A) from the viewpoint of good curability and the good physical properties of a cured product.

In the thermosetting resin composition according to the present invention, a curing agent for epoxy resin may be used in addition to the active ester resin (A) and epoxy resin (B). Examples of the curing agent for epoxy resin that can be used include curing agents containing amine compounds, amide compounds, acid anhydride compounds, and phenolic compounds. Specifically, examples of the amine compounds include diaminodiphenylmethane, diethylenetriamine, triethylenetetramine, diaminodiphenylsulfone, isophoronediamine, imidazole, $BF_3$-amine complexes, and guanidine derivatives. Examples of the amide compounds include dicyandiamide and polyamide resins synthesized from a linolenic acid dimer and ethylenediamine. Examples of the acid anhydride compounds include phthalic anhydride, trimellitic anhydride, pyromellitic anhydride, maleic anhydride, tetrahydrophthalic anhydride, methyltetrahydrophthalic anhydride, methyl nadic anhydride, hexahydrophthalic anhydride, and methylhexahydrophthalic anhydride. Examples of the phenol compounds include polyhydric phenol compounds such as phenol novolac resins, cresol novolac resins, aromatic hydrocarbon formaldehyde resin-modified phenol resins, dicyclopentadiene phenol addition-type resins, phenol aralkyl resins, naphthol aralkyl resins, trimethylolmethane resins, tetraphenylolethane resins, naphthol novolac resins, naphthol-phenol co-condensed novolac resins, naphthol-cresol co-condensed novolac resins, biphenyl-modified phenol resins (polyhydric phenol compounds having phenol nuclei connected through bismethylene groups), biphenyl-modified naphthol resins (polyhydric naphthol compounds having phenol nuclei connected through bismethylene groups), and aminotriazine-modified phenol resins (polyhydric phenol compounds having phenol nuclei connected through melamine or benzoguanamine).

Among these phenol compounds, phenol compounds each having many aromatic skeletons in its molecular structure are preferable from the viewpoint of flame retardant effect. Specifically, phenol novolac resins, cresol novolac resins, aromatic hydrocarbon formaldehyde resin-modified phenol resins, phenol aralkyl resins, naphthol aralkyl resins, naphthol novolac resins, naphthol-phenol co-condensed novolac resins, naphthol-cresol co-condensed novolac resins, biphenyl-modified phenol resins, biphenyl-modified naphthol resins, and aminotriazine-modified phenol resins are preferable because of excellent flame retardancy.

When the curing agent for epoxy resin is used, the amount of use is preferably in the range of 10% to 50% by mass from the viewpoint of dielectric characteristics.

If needed, a curing accelerator can also be appropriately added to the thermosetting resin composition according to the present invention. Various agents can be used as the curing accelerator and examples thereof include phosphorus-based compounds, tertiary amines, imidazole, organic acid metal salts, Lewis acids, and amine complex salts. In particular, for build-up material and circuit board usage, dimethylaminopyridine and imidazole are preferable from the viewpoint of excellent heat resistance, dielectric characteristics, solder resistance, etc. In particular, for semiconductor encapsulating material usage, triphenylphosphine as the phosphorus-based compound and 1,8-diazabicyclo-[5.4.0]-undecene (DBU) as the tertiary amine are preferable from the viewpoint of excellent curability, heat resistance, electrical characteristics, moisture-resistance reliability, etc.

The above-detailed thermosetting resin composition according to the present invention is characterized by exhibiting excellent solvent solubility as described above. Therefore, the thermosetting resin composition preferably contains an organic solvent (C) in addition to the above components. Examples of the organic solvent (C) that can be used include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. The selection and proper amount of organic solvent (C) used can be appropriately determined depending on usages. For example, for printed circuit board usage, polar solvents with a boiling point of 160° C. or less, such as methyl ethyl ketone, acetone, or 1-methoxy-2-propanol, are preferable, and they are preferably used so that the nonvolatile component proportion is 40% to 80% by mass. For adhesive film for build-up usage, preferred examples of the organic solvent (C) include ketones such as acetone, methyl ethyl ketone, and cyclohexanone; acetic esters such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; dimethylformamide; dimethylacetamide; and N-methylpyrrolidone, and they are preferably used so that the nonvolatile component proportion is 30% to 60% by mass.

In order to exhibit flame retardancy, for example, in the field of printed circuit boards, the thermosetting resin composition may contain a non-halogen flame retardant that contains substantially no halogen atoms within a range that does not degrade reliability.

Examples of the non-halogen flame retardant include phosphorus-based flame retardants, nitrogen-based flame retardants, silicone-based flame retardants, inorganic flame retardants, and organic metal salt-based flame retardants. Use of these flame retardants is not particularly limited, and they may be used alone or in combination of a plurality of flame retardants of the same type or different types.

The phosphorus-based flame retardant may be either inorganic phosphorus-based flame retardant or organic phosphorus-based flame retardant. Examples of inorganic compound include red phosphorus; ammonium phosphates such as monoammonium phosphate, diammonium phosphate, triammonium phosphate, and ammonium polyphosphate; and inorganic nitrogen-containing phosphorus compounds such as phosphoric amide.

The red phosphorus is preferably surface-treated for preventing hydrolysis, etc. Examples of the surface treatment method include (i) a method of coating the red phosphorus with an inorganic compound such as magnesium hydroxide, aluminum hydroxide, zinc hydroxide, titanium hydroxide, bismuth oxide, bismuth hydroxide, bismuth nitrate, or a mixture of these inorganic compounds, (ii) a method of coating the red phosphorus with a mixture of an inorganic compound such as magnesium hydroxide, aluminum hydroxide, zinc hydroxide, or titanium hydroxide, and a thermosetting resin such as a phenol resin, and (iii) a double coating method of coating the red phosphorus with a film composed of an inorganic compound such as magnesium hydroxide, aluminum hydroxide, zinc hydroxide, or titanium hydroxide, and coating the film with a thermosetting resin such as a phenol resin.

Examples of the organic phosphorus compound include general-purpose organic phosphorus compounds such as phosphoric ester compounds, phosphonic acid compounds, phosphinic acid compounds, phosphine oxide compounds, phosphorane compounds, and organic nitrogen-containing phosphorus compounds; cyclic organic phosphorus compounds such as 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide; and derivatives produced by reaction of the phosphorus compounds with a compound such as an epoxy resin, a phenol resin, or the like.

The blending amount is appropriately selected in accordance with the type of the phosphorus-based flame retardant, the other components of the thermosetting resin composition, and the desired degree of flame retardancy. For example, when red phosphorus is used as the non-halogen flame retardant, the blending amount is preferably in the range of 0.1 to 2.0 parts by mass in 100 parts by mass of the thermosetting resin composition that contains all of the active ester resin (A), the epoxy resin (B), the non-halogen flame retardant, and other components such as fillers and additives. When the organic phosphorus compound is used, the blending amount is preferably in the range of 0.1 to 10.0 parts by mass and particularly preferably in the range of 0.5 to 6.0 parts by mass in the similar manner.

The phosphorus-based flame retardant may be used together with hydrotalcite, magnesium hydroxide, a boron compound, zirconium oxide, a black dye, calcium carbonate, zeolite, zinc molybdate, activated carbon, or the like.

Examples of the nitrogen-based flame retardant include triazine compounds, cyanuric acid compounds, isocyanuric acid compounds, and phenothiazine. The triazine compounds, the cyanuric acid compounds, and the isocyanuric acid compounds are preferable.

Examples of the triazine compounds include melamine, acetoguanamine, benzoguanamine, melon, melam, succinoguanamine, ethylenedimelamine, melamine polyphosphate, triguanamine, aminotriazine sulfate compounds such as guanylmelamine sulfate, melem sulfate, and melam sulfate, the above-mentioned aminotriazine-modified phenol resin, and the aminotriazine-modified, phenol resin further modified with tung oil, isomerized linseed oil, or the like.

Specific examples of the cyanuric acid compounds include cyanuric acid and melamine cyanurate.

The amount of nitrogen-based flame retardant blended is appropriately selected in accordance with the type of the nitrogen-based flame retardant, the other components of the thermosetting resin composition, and the desired degree of flame retardancy, and preferably, for example, in the range of 0.05 to 10 parts by mass and particularly in the range of 0.1 to 5 parts by mass in 100 parts by mass of the thermosetting resin composition that contains all of the active ester resin (A), the epoxy resin (B), the non-halogen flame retardant, and other components such as fillers and additives.

The nitrogen-based flame retardant may be used together with a metal hydroxide, a molybdenum compound, or the like.

The silicone-based flame retardant may contain any organic compound that contains silicon atoms, which is not particularly limited. Examples of the silicone-based flame retardant include silicone oil, silicone rubber, and silicone resins.

The amount of silicone-based flame retardant blended is appropriately selected in accordance with the type of the silicone-based flame retardant, the other components of the thermosetting resin composition, and the desired degree of flame retardancy, and preferably, for example, in the range of 0.05 to 20 parts by mass in 100 parts by mass of the thermosetting resin composition that contains all of the active ester resin (A), the epoxy resin (B), the non-halogen flame retardant, and other components such as fillers and additives. The silicone-based flame retardant may be used together with a molybdenum compound, alumina, or the like.

Examples of the inorganic flame retardant include metal hydroxides, metal oxides, metal carbonate compounds, metal powders, boron compounds, and low-melting-point glass.

Specific examples of the metal hydroxides include aluminum hydroxide, magnesium hydroxide, dolomite, hydrotalcite, calcium hydroxide, barium hydroxide, and zirconium hydroxide.

Specific examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Specific examples of the metal carbonate compounds include zinc carbonate, magnesium carbonate, calcium carbonate, barium carbonate, basic magnesium carbonate, aluminum carbonate, iron carbonate, cobalt carbonate, and titanium carbonate.

Specific examples of the metal powders include powders of aluminum, iron, titanium, manganese, zinc, molybdenum, cobalt, bismuth, chromium, nickel, copper, tungsten, and tin.

Specific examples of the boron compounds include zinc borate, zinc metaborate, barium metaborate, boric acid, and borax.

Specific examples of the low-melting-point glass include Seaplea (Bokusui Brown Co., Ltd.), hydrated glass $SiO_2$—$MgO$—$H_2O$ and glassy compounds based on $PbO$—$B_2O_3$, $ZnO$-$P_2O_5$—$MgO$, $P_2O_5$—$B_2O_3$—$PbO$—$MgO$, $P$—$Sn$—$O$—$F$, $PbO$—$V_2O_5$—$TeO_2$, $Al_2O_3$—$H_2O$, and lead borosilicate.

The amount of inorganic flame retardant blended is appropriately selected in accordance with the type of the inorganic flame retardant, the other components of the thermosetting resin composition, and the desired degree of flame retardancy, and preferably, for example, in the range of 0.05 to 20 parts by mass and particularly preferably in the range of 0.5 to 15 parts by mass in 100 parts by mass of the thermosetting resin composition that contains all of the active ester resin (A), the epoxy resin (B), the non-halogen flame retardant, and other components such as fillers and additives.

Examples of the organic metal salt-based flame retardant include ferrocene, metal acetylacetonate complexes, organic metal carbonyl compounds, organic cobalt salt compounds, organic sulfonic acid metal salts, and compounds having ionic bonds or coordinate bonds between metal atoms and aromatic compounds or heterocyclic compounds.

The amount of organic metal salt-based flame retardant blended is appropriately selected in accordance with the type of the organic metal salt-based flame retardant, the other components of the thermosetting resin composition, and the desired degree of flame retardancy, and preferably, for example, in the range of 0.005 to 10 parts by mass in 100 parts by mass of the thermosetting resin composition that contains all of the active ester resin (A), the epoxy resin (B), the non-halogen flame retardant, and other components such as fillers and additives.

If needed, an inorganic filler can be blended in the thermosetting resin composition according to the present invention. Examples of the inorganic filler include fused silica, crystalline silica, alumina, silicon nitride, and aluminum hydroxide. In order to markedly increase the amount of inorganic filler blended, the fused silica is preferably used. Although either crushed or spherical fused silica can be used, spherical fused silica is preferably mainly used for increasing the amount of fused silica blended and suppressing an increase in the melt viscosity of a molding material. In order to further increase the amount of spherical silica blended, the grain size distribution of the spherical silica is preferably properly adjusted. The filling ratio is preferably as high as possible from the viewpoint of flame retardancy, and particularly preferably 20% by mass or more of the whole amount of thermosetting resin composition. For usage of conductive paste or the like, conductive fillers such as a silver powder and a copper powder can be used.

If needed, various compounding agents such as a silane coupling agent, a mold release agent, a pigment, and an emulsifier can be added to the thermosetting resin composition according to the present invention.

The thermosetting resin composition according to the present invention can be produced by uniformly mixing the above-described components. The thermosetting resin composition according to the present invention, which contains the active ester resin (A) and the epoxy resin (B) and, if needed, further contains the curing accelerator, can be easily formed into a cured product by the same method as generally known methods. Examples of the cured product include shaped cured products such as laminated products, cast products, adhesive layers, coating films, and films.

Examples of usages of the thermosetting resin composition according to the present invention include hard printed circuit board materials, resin compositions for flexible circuit boards, insulating materials for circuit boards such as interlayer insulating materials for build-up substrates, semiconductor encapsulating materials, conductive paste, adhesive films for build-up, resin casting materials, and adhesives. Among these various usages, for hard printed circuit board material usage, insulating materials for electronic circuit boards, and adhesive films for build-up, the thermosetting resin composition can be used as insulating materials for so-called electronic-components-embedded substrates in which a passive component such as a capacitor and an active component such as an IC chip are embedded. In particular, from the viewpoint of the characteristics such as high flame retardancy, high heat resistance, low thermal expansion property, and solvent solubility, the thermosetting, resin composition is preferably used for materials for circuit boards such as hard printed circuit board materials, resin compositions for flexible circuit boards, and interlayer insulating materials for build-up substrates, and semiconductor encapsulating materials.

A circuit board according to the present invention is produced by diluting the thermosetting resin composition with an organic solvent to prepare a varnish, forming the varnish into a plate, laminating a copper foil on the plate, and then molding the laminated plate under heat and pressure. Specifically, for example, a method for producing a hard printed circuit board includes further blending an organic solvent with the varnish-like thermosetting resin composition that contains the organic solvent to prepare a varnish, impregnating a reinforcement substrate with the varnish, semi-curing the substrate to prepare a pre-preg according to the present invention, laminating a copper foil on the pre-preg, and thermocompression-bonding the copper foil and the pre-preg with each other. Examples of the reinforcement substrate include paper, a glass cloth, a glass nonwoven fabric, aramid paper, an aramid cloth, a glass mat, and a glass roving cloth. In detail, in this method, first, the varnish-like thermosetting resin composition is heated to a heating temperature according to the type of solvent used, preferably 50° C. to 170° C., to form a pre-preg as a cured product. The mass ratio between the thermosetting resin composition and the reinforcement substrate used is not particularly limited but is preferably adjusted so that the resin content in the pre-preg is 20% to 60% by mass. Then, the pre-pregs formed as described above are laminated by a common method, and a copper foil is appropriately laminated thereon and thermocompression-bonded at 170° C. to 250° C. for 10 minutes to 3 hours under a pressure of 1 to 10 MPa. Thus, an intended circuit board can be produced.

In order to produce a flexible circuit board using the thermosetting resin composition according to the present invention, the active ester resin (A), the epoxy resin (B), and the organic solvent are blended and applied to an electrically insulating film with a coater such as a reverse roll coater or a comma coater. Then, the film is heated at 60° C. to 170° C. for 1 to 15 minutes using a heater to evaporate the solvent and bring an adhesive composition into the B-stage. Next, a metal foil is thermocompression-bonded to the adhesive using a heating roll or the like. During this boding, the compression-bonding pressure is preferably 2 to 200 N/cm$^2$, and the compression-bonding temperature is preferably 40° C. to 200° C. The compression bonding may be finished if sufficient adhesion performance is obtained. However, post-curing is preferably further performed at 100° C. to 200° C. for 1 to 24 hours if complete curing is required. The thickness of the adhesive composition film after final curing is preferably in the range of 5 to 100 μm.

A method for producing an interlayer insulating material for build-up substrate using the thermosetting resin composition according to the present invention includes applying the thermosetting resin composition that contains rubber, filler, and the like appropriately to a circuit board that has a circuit formed thereon by a spray coating method, a curtain coating method, or the like, and then curing the resin composition. Next, holes such as predetermined through holes are formed if needed, and then a surface is treated with a coarsening agent, washed with hot water to form projections and depressions, and then plated with a metal such as copper. Preferred examples of the plating method include electroless plating and electrolytic plating. Examples of the coarsening agent include an oxidizer, an alkali, and an organic solvent. Such an operation is successively repeated as many times as needed to alternately build up a resin insulating layer and a conductor layer that has a predetermined circuit pattern, thereby producing a build-up substrate. Note that the through holes are formed after the outermost resin insulating layer is formed. Also note that the build-up substrate can be formed by thermocompression-bonding a copper foil with a resin, which is formed by semi-curing the resin composition on the copper foil, at 170° C. to 250° C. on a circuit board that has a circuit formed thereon, without the step of forming a coarsened surface and the step of plating.

A method for producing a semiconductor encapsulating material from the thermosetting resin composition according to the present invention includes melt-mixing the compounding agents such as the active ester resin (A), the epoxy resin (B), and an inorganic filler sufficiently until the resulting mixture becomes uniform using an extruder, a kneader, a roll, or the like appropriately. Silica is generally used as the inorganic filler. When silica is used, the semiconductor encapsulating material according to the present invention is produced by blending the inorganic filler in a proportion of 70% to 95% by mass in the thermosetting resin composition. A method for molding the thermosetting resin composition into a semiconductor package includes molding the composition by casting or using a transfer molding machine, injection molding machine, or the like and then heating at 50° C. to 200° C. for 2 to 10 hours, thereby producing a semiconductor device as a molded product.

A method for producing an adhesive film for build up from the thermosetting resin composition according to the present invention includes, for example, applying the thermosetting resin composition according to the present invention onto a support film to form a resin composition layer, thereby producing an adhesive film for multilayer printed circuit board.

When the thermosetting resin composition of the present invention is used as an adhesive film for build up, it is important that the adhesive film soften under the lamination temperature condition (usually at 70° C. to 140° C.) set for the vacuum lamination method and exhibits fluidity (resin flow) that allows the resin to fill in via holes or through holes present in the circuit board while laminating the circuit board. Therefore, the above-described components are preferably blended so as to exhibit these characteristics.

The through holes in the multilayer printed circuit board generally have a diameter of 0.1 to 0.5 mm and a depth of 0.1 to 1.2 mm. Generally, it is preferable that the multilayer printed circuit board can be filled with resin within this range. When both surfaces of the circuit board are laminated, the through holes are preferably about ½ filled.

Specifically, the method for producing the adhesive film includes preparing the varnish-like thermosetting resin composition according to the present invention, applying the varnish-like composition onto a surface of a support film, and further drying the organic solvent by, for example, heating or hot air spraying to form a layer (a) composed of the thermosetting resin composition.

The thickness of the layer (a) formed is generally equal to or more than the thickness of the conductor layer. Since the thickness of the conductor layer in the circuit board is generally in the range of 5 to 70 μm, the thickness of the resin composition layer is preferably 10 to 100 μm.

The layer (a) may be protected by a protecting film described below. Protecting by the protecting film can prevent adhesion of dust to the surface of the resin composition layer and scratches thereon.

Examples of the support film and the protecting film include films of polyolefins such as polyethylene, polypropylene, and polyvinyl chloride, polyesters such as polyethylene terephthalate (hereafter, may be abbreviated as "PET"), and polyethylene naphthalate, polycarbonate, polyimide; release paper; and metal foils such as a copper foil and an aluminum foil. The support film and the protecting film may be subjected to MAD treatment, corona treatment, or release treatment.

The thickness of the support film is not particularly limited, but is generally 10 to 150 μm and preferably in the range of 25 to 50 μm. The thickness of the protecting film is preferably 1 to 40 μm.

The support film is separated after being laminated on the circuit board or after the insulating film is formed by heat curing. Adhesion of dust in the curing step can be prevented by separating the support film after the adhesive film is heat-cured. When the support film is to be separated after curing, generally, the support film is subjected to a release treatment prior to separation.

A method for producing the multilayer printed circuit board using the adhesive film formed as described above includes, for example, when the layer (a) is protected by the protecting film, separating the protecting film, and then laminating the layer (a) on one or both surfaces of the circuit board by a vacuum lamination method or the like so that the layer is in direct contact with the circuit board. The lamination method may be a batch-type lamination method or a continuous-type lamination method using a roll. If needed, the adhesive film and the circuit board may be heated (preheated) prior to lamination.

The lamination is preferably performed under the following conditions: compression-bonding temperature (lamination temperature) of 70° C. to 140° C., compression-bonding pressure of 1 to 11 kgf/cm$^2$ (9.8×10$^4$ to 107.9×10$^4$ N/m2), and under a reduced air pressure of 20 mmHg (26.7 hPa) or less.

Examples of a method for using the thermosetting resin composition according to the present invention as conductive paste include a method of preparing a composition for an anisotropic conductive film by dispersing conductive fine particles in the thermosetting resin composition, and a method of preparing a circuit-connecting paste resin composition or an anisotropic conductive adhesive that is liquid at room temperature.

The thermosetting resin composition according to the present invention can be used as a resist ink. In this case, a usable method includes preparing a resist ink composition by blending a vinyl monomer having an ethylenically unsaturated double bond and a cationic polymerization catalyst serving as a curing agent in the thermosetting resin composition, and further adding a pigment, talc, and filler thereto, applying the resist ink composition onto a printed board by a screen printing method, and producing a resist ink cured product.

A cured product according to the present invention can be produced by, for example, heating the composition prepared by the above-described method in a temperature range of about 20° C. to about 250° C.

Therefore, according to the present invention, a thermosetting resin composition that exhibits high flame retardancy and excellent environmental friendliness can be produced without using a halogen-based flame retardant. In addition, excellent dielectric characteristics of a cured product thereof permit the realization of higher operation speeds in high-frequency devices. Further, the phenolic hydroxyl group-containing resin can be easily produced with high efficiency by the production method according to the present invention, and molecular design can be made according to the above-described intended performance level.

EXAMPLES

The present invention is described specifically below with reference to Examples. A softening point, GPC, and $^{13}$C-NMR were measured under the following conditions.
1) Softening point measuring method: measured in accordance with JIS K7234
2) GPC:
Measurement instrument: "HLC-8220 GPC" produced by Tosoh Corporation
Column: Guardcolumn "H$_{xL}$-L" produced by Tosoh Corporation
+"TSK-GEL G2000HXL" produced by Tosoh Corporation
+"TSK-GEL G2000HXL" produced by Tosoh Corporation
+"TSK-GEL G3000HXL" produced by Tosoh Corporation
+"TSK-GEL G4000HXL" produced by Tosoh Corporation
Detector: RI (differential refractometer)
Data processing: "GPC-8020 model II version 4.10" produced by Tosoh Corporation
Measurement conditions: Column temperature 40° C.
Developing solvent Tetrahydrofuran
Flow rate 1.0 ml/min
Standard: In accordance with a measurement manual of "GPC-8020 model II version 4.10" mentioned above, the following monodisperse polystyrenes whose molecular weights were known were used.
(Polystyrenes Used)
"A-500" produced by Tosoh Corporation
"A-1000" produced by Tosoh Corporation
"A-2500" produced by Tosoh Corporation
"A-5000" produced by Tosoh Corporation
"F-1" produced by Tosoh Corporation
"F-2" produced by Tosoh Corporation "F-4" produced by Tosoh Corporation
"F-10" produced by Tosoh Corporation
"F-20" produced by Tosoh Corporation
"F-40" produced by Tosoh Corporation
"F-80" produced by Tosoh Corporation
"F-128" produced by Tosoh Corporation
Sample: A tetrahydrofuran solution having a resin solid content of 1.0% by mass filtered through a microfilter (50 μl)
$^{13}$C-NMR: measured with "NMR GSX270" produced by JEOL, Ltd.

Example 1

Into a flask equipped with a thermometer, a dropping funnel, a cooling tube, a fractionating column, and a stirrer, 104 g of a phenol novolac resin (a-1) ("PHENOLITE TD-2131" produced by DIC Corporation, softening point: 80° C., hydroxyl equivalent: 104 g/eq., the average of n in structural formula a1: 4) and 618 g of methyl isobutyl ketone (hereafter, abbreviated as "MIBK") were charged to prepare a solution under reduced pressure in a nitrogen-purged system. Then, 5.1 g (0.025 moles) of isophthalic acid chloride was charged, and 10.5 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 133.5 g (0.95 moles) of benzoyl chloride was charged, and 199.5 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-1). The active ester resin (A-1) had a functional group equivalent of 206 g/eq. determined from the charging ratio and a softening point of 86° C. The esterification rate of phenolic hydroxyl groups was 100%.

The formation of carbonyl carbons derived from ester groups was confirmed by a peak at 165 ppm in $^{13}$C-NMR (FIG. 10).

Example 2

Figure 1:
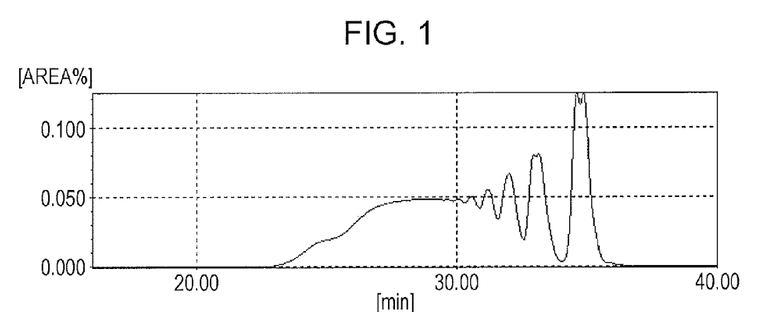
FIG. 1 is a GPC chart of an active ester resin (A-2) produced in Example 2.
Figure 2:
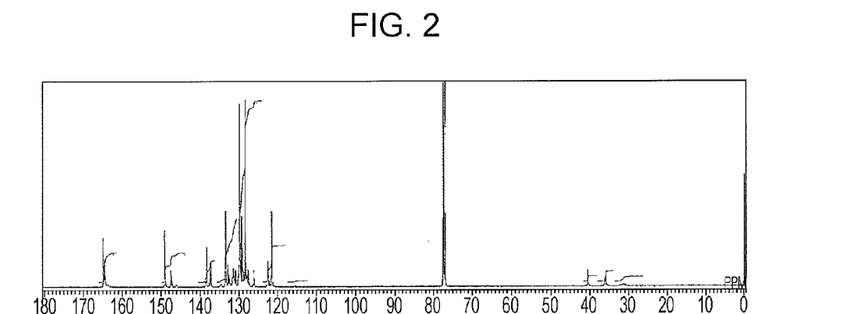
FIG. 2 is a $^{13}$C-NMR chart of the active ester resin (A-2) produced in Example 2.

Into a flask equipped with a thermometer, a dropping funnel, a cooling tube, a fractionating column, and a stirrer, 104 g of a phenol novolac resin (a-1) ("PHENOLITE TD-2131" produced by DIC Corporation, softening point: 80° C., hydroxyl equivalent: 104 g/eq., the average of n in structural formula a1: 4) and 612 g of methyl isobutyl ketone (hereafter, abbreviated as "MIBK") were charged to prepare a solution under reduced pressure in a nitrogen-purged system. Then, 10.1 g (0.05 moles) of isophthalic acid chloride was charged, and 21.0 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 133.5 g (0.90 moles) of benzoyl chloride was charged, and 189.0 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-2). The active ester resin (A-2) had a functional group equivalent of 204 g/eq. determined from the charging ratio and a softening point of 90° C. FIGS. 1 and 2 show a GPC chart and a $^{13}$C-NMR chart of the active ester resin (A-2), respectively.

Example 3

Into a flask equipped with a thermometer, a dropping funnel, a cooling tube, a fractionating column, and a stirrer, 104 g of a phenol novolac resin (A-1) ("PHENOLITE TD-2131" produced by DIC Corporation, softening point: 80° C., hydroxyl equivalent: 104 g/eq., the average of n in structural formula a1: 4) and 600 g of methyl isobutyl ketone (hereafter, abbreviated as "MIBK") were charged to prepare a solution under reduced pressure in a nitrogen-purged system. Then, 20.2 g (0.10 moles) of isophthalic acid chloride was charged, and 42.0 g of a 20% aqueous sodium hydroxide solution was added dropwise over 2 hours under nitrogen gas purging while maintaining the interior of the system at 60° C. or less. The mixture was stirred under the same conditions for 1.0 hours. Then, 112.4 g (0.80 moles) of benzoyl chloride was charged, and 168.0 g of a 20% aqueous sodium hydroxide solution was added dropwise over 3 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-3). The active ester resin (A-3) had a functional group equivalent of 200 g/eq. determined from the charging ratio and a softening point of 95° C.

Example 4

Into a flask equipped with a thermometer, a dropping funnel, a cooling tube, a fractionating column, and a stirrer, 104 g of a phenol novolac resin (A-1) ("PHENOLITE TD-2131" produced by DIC Corporation, softening point: 80° C., hydroxyl equivalent: 104 g/eq., the average of n in structural formula a1: 4) and 564 g of methyl isobutyl ketone (hereafter, abbreviated as "MIBK") were charged to prepare a solution under reduced pressure in a nitrogen-purged system. Then, 50.5 g (0.25 moles) of isophthalic acid chloride was charged, and 105.0 g of a 20% aqueous sodium hydroxide solution was added dropwise over 2.5 hours under nitrogen gas purging while maintaining the interior of the system at 60° C. or less. The mixture was stirred under the same conditions for 1.0 hours. Then, 70.3 g (0.50 moles) of benzoyl chloride was charged, and 105.0 g of a 20% aqueous sodium hydroxide solution was added dropwise over 2.5 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-4). The active ester resin (A-4) had a functional group equivalent of 188 g/eq. determined from the charging ratio and a softening point of 105° C.

Example 5

Into a flask equipped with a thermometer, a dropping funnel, a cooling tube, a fractionating column, and a stirrer, 105 g of a phenol novolac resin (a-2) ("PHENOLITE TD-2090" produced by DIC Corporation, softening point: 120° C., hydroxyl equivalent: 105 g/eq., the average of n in structural formula a1: 8) and 615 g of methyl isobutyl ketone (hereafter, abbreviated as "MIBK") were charged to prepare a solution under reduced pressure in a nitrogen-purged system. Then, 10.1 g (0.05 moles) of isophthalic acid chloride was charged, and 21.0 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 133.5 g (0.90 moles) of benzoyl chloride was charged, and 189.0 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-5). The active ester resin (A-5) had a functional group equivalent of 205 g/eq. determined from the charging ratio and a softening point of 135° C.

Example 6

Into a flask equipped with a thermometer, a dropping funnel, a cooling tube, a fractionating column, and a stirrer, 104 g of a phenol novolac resin (a-1) ("PHENOLITE TD-2131" produced by DIC Corporation, softening point: 80° C., hydroxyl equivalent: 104 g/eq., the average of n in structural formula a1: 4) and 582 g of methyl isobutyl ketone (hereafter, abbreviated as "MIBK") were charged to prepare a solution under reduced pressure in a nitrogen-purged system. Then, 10.1 g (0.05 moles) of isophthalic acid chloride was charged, and 21.0 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 112.4 g (0.80 moles) of benzoyl chloride was charged, and 168.0 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-6). The active ester resin (A-6) had a functional group equivalent of 194 g/eq. determined from the charging ratio and a softening point of 92° C.

Example 7

Into a flask equipped with a thermometer, a dropping funnel, a cooling tube, a fractionating column, and a stirrer, 182 g of a phenol aralkyl resin (a-3) ("MEH-7800-3H" produced by Meiwa Plastic Industries, Ltd., softening point: 105° C., hydroxyl equivalent: 182 g/eq., n in structural formula a7: 0 to 7) and 867 g of methyl isobutyl ketone (hereafter, abbreviated as "MIBK") were charged to prepare a solution under reduced pressure in a nitrogen-purged system. Then, 10.1 g (0.05 moles) of isophthalic acid chloride was charged, and 21.0 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 133.5 g (0.90 moles) of benzoyl chloride was charged, and 189.0 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-7). The active ester resin (A-7) had a functional group equivalent of 289 g/eq. determined from the charging ratio and a softening point of 103° C.

Example 8

Into a flask equipped with a thermometer, a dropping funnel, a cooling tube, a fractionating column, and a stirrer, 241 g of a biphenyl aralkyl resin (a-4) ("MEH-7851-4H" produced by Meiwa Plastic Industries, Ltd., softening point: 122° C., hydroxyl equivalent: 241 g/eq., n in structural formula a9: 0 to 7) and 1044 g of methyl isobutyl ketone (hereafter, abbreviated as "MIBK") were charged to prepare a solution under reduced pressure in a nitrogen-purged system. Then, 10.1 g (0.05 moles) of isophthalic acid chloride was charged, and 21.0 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 133.5 g (0.90 moles) of benzoyl chloride was charged, and 189.0 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-8). The active ester resin (A-8) had a functional group equivalent of 348 g/eq. determined from the charging ratio and a softening point of 87° C.

Example 9

Into a flask equipped with a thermometer, a dropping funnel, a cooling tube, a fractionating column, and a stirrer, 180 g of a dicyclopentadiene phenol resin (a-5) ("J-DPP-115" produced by JFE Chemical Corporation, softening point: 120° C., hydroxyl equivalent: 180 g/eq., the average of n in structural formula aII: 3) and 864 g of methyl isobutyl ketone (hereafter, abbreviated as "MIBK") were charged to prepare a solution under reduced pressure in a nitrogen-purged system. Then, 10.1 g (0.05 moles) of isophthalic acid chloride was charged, and 21.0 g of a 20% aqueous sodium hydroxide solution was added dropwise over 1 hour under nitrogen gas purging while maintaining the interior of the system at 60° C. or less. The mixture was stirred under the same conditions for 1.0 hours. Then, 133.5 g (0.90 moles) of benzoyl chloride was charged, and 189.0 g of a 20% aqueous sodium hydroxide solution was added dropwise over 4 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-9). The active ester resin (A-9) had a functional group equivalent of 288 g/eq. determined from the charging ratio and a softening point of 125° C.

Comparative example 1

Into a flask equipped with a thermometer, a dropping funnel, a cooling tube, a fractionating column, and a stirrer, 104 g of a phenol novolac resin (a-1) ("PHENOLITE TD-2131" produced by DIC Corporation, softening point: 80° C., hydroxyl equivalent: 104 g/eq., the average of n in structural formula aI: 4) and 552 g of methyl isobutyl ketone (hereafter, abbreviated as "MIBK") were charged to prepare a solution under reduced pressure in a nitrogen-purged system. Then, 60.6 g (0.30 moles) of isophthalic acid chloride was charged, and 126.0 g of a 20% aqueous sodium hydroxide solution was added dropwise over 3 hours under nitrogen gas purging while maintaining the interior of the system at 60° C. or less. The mixture was stirred under the same conditions for 1.0 hours. Then, 56.2 g (0.40 moles) of benzoyl chloride was charged, and 84.0 g of a 20% aqueous sodium hydroxide solution was added dropwise over 2 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-10). The active ester resin (A-10) had a functional group equivalent of 184 g/eq. determined from the charging ratio and a softening point of 108° C.

Comparative example 2

Into a flask equipped with a thermometer, a dropping funnel, a cooling tube, a fractionating column, and a stirrer, 104 g of a phenol novolac resin (a-1) ("PHENOLITE TD-2131" produced by DIC Corporation, softening point: 80° C., hydroxyl equivalent: 104 g/eq., the average of n in structural formula a1: 4) and 624 g of methyl isobutyl ketone (hereafter, abbreviated as "MIBK") were charged to prepare a solution under reduced pressure in a nitrogen-purged system. Then, 140.5 g (1.00 moles) of benzoyl chloride was charged, and 210.0 g of a 20% aqueous sodium hydroxide solution was added dropwise over 3 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-11). The active ester resin (A-11) had a functional group equivalent of 208 g/eq. determined from the charging ratio and a softening point of 81° C.

Comparative example 3

Active ester resin (A-12) was produced by the same reaction as in Synthesis example 8 except that 105 g of a phenol novolac resin (a-2) ("PHENOLITE TD-2090" produced by DIC Corporation, hydroxyl equivalent: 105 g/eq., the average of n in structural formula a1: 8) was used instead of the phenol resin (a-1). The active ester resin (A-12) had a functional group equivalent of 209 g/eq. determined from the charging ratio.

Comparative example 4

Into a flask equipped with a thermometer, a dropping funnel, a cooling tube, a fractionating column, and a stirrer, 104 g of a phenol novolac resin (a-1) ("PHENOLITE TD-2131"

produced by DIC Corporation, softening point: 80° C., hydroxyl equivalent: 104 g/eq., the average of n in structural formula a1: 4) and 594 g of methyl isobutyl ketone (hereafter, abbreviated as "MIBK") were charged to prepare a solution under reduced pressure in a nitrogen-purged system. Then, 126.5 g (0.90 moles) of benzoyl chloride was charged, and 189.0 g of a 20% aqueous sodium hydroxide solution was added dropwise over 3 hours under nitrogen gas purging while maintaining the interior of the system at 60° C. or less. The mixture was stirred under the same conditions for 1.0 hours. After the completion of reaction, the mixture was left to stand in order to separate into phases, and an aqueous layer was removed. Next, water was poured into a MIBK phase in which the reaction product was dissolved, and mixed under stirring for about 15 minutes. The mixture was left to stand in order to separate into phases, and an aqueous layer was removed. This operation was repeated until the pH of the aqueous layer reached 7. Then, the moisture was removed by dehydration using a decanter, and MIBK was removed by reduced-pressure dehydration to produce an active ester resin (A-13). The active ester resin (A-13) had a functional group equivalent of 198 g/eq. determined from the charging ratio and a softening point of 84° C.

Examples 10 to 18 and Comparative Examples 5 to 8

Preparation of Epoxy Resin Compositions and Evaluation of Physical Properties

In accordance with the blending ratio shown in Tables 1 and 2 below, an epoxy resin, i.e., a dicyclopentadiene-type epoxy resin (polyglycidyl ether of polycondensate between dicyclopentadiene and phenol, epoxy equivalent: 275 g/eq, softening point: 82° C.) and a curing agent, i.e., each of (A-1) to (A-13) were blended, and 0.1 phr of dimethylaminopyridine was added as a curing catalyst. Then, methyl ethyl ketone was blended in such a manner that the nonvolatile content (N.V.) of each composition was finally 58% by mass.

Next, laminated plates were experimentally formed by curing under the following conditions, and the heat resistance, dielectric characteristics, and flame retardancy were evaluated by the following methods. The results are shown in Tables 1 and 2.

<Laminated Plate Preparation Conditions>

Substrate: Glass Cloth "#2116" (210×280 mm) produced by Nitto Boseki Co., Ltd.

Number of plies: 6, Pre-pregnating condition: 160° C.

Curing conditions: 200° C., 40 kg/cm$^2$, and 1.5 hours, Thickness after molding: 0.8 mm <Heat Resistance (Glass Transition Temperature)>

A temperature at which the maximum change in elastic modulus (maximum rate of change in tan δ) occurred was determined as a glass transition temperature using a viscoelasticity measuring apparatus (DMA: EXTRA 6000 produced by Seiko Instruments Inc.; frequency: 1 Hz, heating rate: 3° C./min).

<Measurement of Dielectric Constant and Dielectric Loss Tangent>

In accordance with JIS-C-6481, a dielectric constant and dielectric loss tangent of a test piece at 1 GHz, the test piece being stored in a room at 23° C. and at a humidity of 50.% for 24 hours after absolute drying, were measured by resonant cavity method using network analyzer "E8362C" produced by Agilent Technologies Ltd.

<Measurement of Thermal Expansion Coefficient>

A thermal expansion coefficient in the range of 40° C. to 60° C. during $2^{nd}$ heating was measured with a thermomechanical analysis apparatus (TMA/SS 6100 produced by SII NanoTechnology Inc, heating rate: 10° C./min).

TABLE 1

|  |  | Example 10 | Example 11 | Example 12 | Example 13 | Example 14 | Example 15 | Example 16 | Example 17 | Example 18 |
|---|---|---|---|---|---|---|---|---|---|---|
| Active ester resin | A-1 | 42.8 |  |  |  |  |  |  |  |  |
|  | A-2 |  | 42.6 |  |  |  |  |  |  |  |
|  | A-3 |  |  | 42.1 |  |  |  |  |  |  |
|  | A-4 |  |  |  | 40.6 |  |  |  |  |  |
|  | A-5 |  |  |  |  | 40.1 |  |  |  |  |
|  | A-6 |  |  |  |  |  | 41.4 |  |  |  |
|  | A-7 |  |  |  |  |  |  | 51.2 |  |  |
|  | A-8 |  |  |  |  |  |  |  | 55.9 |  |
|  | A-9 |  |  |  |  |  |  |  |  | 51.2 |
| Epoxy resin |  | 57.2 | 57.4 | 57.9 | 59.4 | 59.9 | 58.6 | 48.8 | 44.1 | 48.8 |
| Heat resistance (° C.) |  | 150 | 166 | 169 | 163 | 180 | 167 | 149 | 158 | 165 |
| Dielectric constant (1 GHz) |  | 3.6 | 3.5 | 3.5 | 3.5 | 3.5 | 3.7 | 3.4 | 3.3 | 3.3 |
| Dielectric loss tangent (1 GHz) |  | 0.009 | 0.007 | 0.007 | 0.008 | 0.008 | 0.008 | 0.006 | 0.006 | 0.005 |
| Thermal expansion coefficient |  | 49 | 48 | 47 | 48 | 48 | 49 | 47 | 47 | 48 |

TABLE 2

|  |  | Comparative Example 5 | Comparative Example 6 | Comparative Example 7 | Comparative Example 8 |
|---|---|---|---|---|---|
| Active ester resin | A-10 | 40.1 |  |  |  |
|  | A-11 |  | 43.2 |  |  |
|  | A-12 |  |  | 43.1 |  |
|  | A-13 |  |  |  | 41.9 |
| Epoxy resin | HP-7200H | 59.9 | 56.8 | 56.9 | 58.1 |

TABLE 2-continued

|  | Comparative Example 5 | Comparative Example 6 | Comparative Example 7 | Comparative Example 8 |
|---|---|---|---|---|
| Heat resistance (° C.) | 135 | 110 | 125 | 120 |
| Dielectric constant (1 GHz) | 3.9 | 4 | 4 | 4.3 |
| Dielectric loss tangent (1 GHz) | 0.01 | 0.018 | 0.017 | 0.022 |
| Thermal expansion coefficient | 53 | 59 | 58 | 61 |

Note of Tables 1 and 2:
A-1: active ester resin (A-1) produced in Example 1
A-2: active ester resin (A-2) produced in Example 2
A-3: active ester resin (A-3) produced in Example 3
A-4: active ester resin (A-4) produced in Example 4
A-5: active ester resin (A-5) produced in Example 5
A-6: active ester resin (A-6) produced in Example 6
A-7: active ester resin (A-7) produced in Example 7
A-8: active ester resin (A-8) produced in Example 8
A-9: active ester resin (A-9) produced in Example 9
A-10: active ester resin (A-10) produced in Comparative Example 1
A-11: active ester resin (A-11) produced in Comparative Example 1
A-12: active ester resin (A-12) produced in Comparative Example 1
A-13: active ester resin (A-13) produced in Comparative Example 1

The invention claimed is:

1. A active ester resin comprising a resin structure produced by reacting a polyfunctional phenolic compound (a1) with a monofunctional aromatic carboxylic acid or its chloride (a2) and an aromatic dicarboxylic acid or its chloride (a3) in such a manner that
an amount of the monofunctional aromatic carboxylic acid or its chloride (a2) is 0.46 to 0.95 moles and
an amount of the aromatic dicarboxylic acid or its chloride (a3) is 0.27 to 0.025 moles
per mole of phenolic hydroxyl groups of the polyfunctional phenolic compound (a1), the polyfunctional phenolic compound (a1) being represented by structural formula (1) below:

[Chem. 1]

(1)

(wherein Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms;
X represents a methylene group, a divalent cyclic aliphatic hydrocarbon group, a phenylene dimethylene group, or a biphenylene-dimethylene group; and n represents the number of repeating units and an average thereof is in a range of 0.5 to 10).

2. The active ester resin according to claim 1, wherein a softening point is in a range of 70° C. to 140° C.

3. The active ester resin according to claim 1 that has a carbonyloxy structure in a proportion of 180 to 400 g/eq.

4. A method for producing an active ester resin, the method comprising reacting a polyfunctional phenolic compound (a1) with a monofunctional aromatic carboxylic acid or its chloride (a2) and an aromatic dicarboxylic acid or its chloride (a3) in such a manner that
an amount of the monofunctional aromatic carboxylic acid or its chloride (a2) is 0.46 to 0.95 moles and
an amount of the aromatic dicarboxylic acid or its chloride (a3) is 0.27 to 0.025 moles
per mole of phenolic hydroxyl groups of the polyfunctional phenolic compound (a1), the polyfunctional phenolic compound (a1) being represented by structural formula (1) below:

[Chem. 2]

(1)

(wherein Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms;
X represents a methylene group, a divalent cyclic aliphatic hydrocarbon group, a phenylene dimethylene group, or a biphenylene-dimethylene group; and n represents the number of repeating units and an average thereof is in a range of 0.5 to 10).

5. The method for producing an active ester resin according to claim 4, wherein the polyfunctional phenolic compound (a1) is reacted with the monofunctional aromatic carboxylic acid or its chloride (a2) and the aromatic dicarboxylic acid or its chloride (a3) in the presence of an basic catalyst.

6. A curable resin composition comprising an active ester resin (A) and an epoxy resin (B) as essential components, the active ester resin (A) having a resin structure produced by reacting a polyfunctional phenolic compound (a1) with a monofunctional aromatic carboxylic acid or its chloride (a2) and an aromatic dicarboxylic acid or its chloride (a3) in such a manner that
an amount of the monofunctional aromatic carboxylic acid or its chloride (a2) is 0.46 to 0.95 moles and
an amount of the aromatic dicarboxylic acid or its chloride (a3) is 0.27 to 0.025 moles
per mole of phenolic hydroxyl groups of the polyfunctional phenolic compound (a1), the polyfunctional phenolic compound (a1) being represented by structural formula (1) below:

[Chem. 3]

(1)

(wherein Ar represents a benzene ring, a naphthalene ring, a benzene ring nuclear-substituted by an alkyl group having 1 to 4 carbon atoms, or a naphthalene ring nuclear-substituted by an alkyl group having 1 to 4 carbon atoms;

X represents a methylene group, a divalent cyclic aliphatic hydrocarbon group, a phenylene dimethylene group, or a biphenylene-dimethylene group; and n represents the number of repeating units and an average thereof is in a range of 0.5 to 10).

7. The curable resin composition according to claim 6, wherein the active ester resin (A) has a softening point in a range of 70° C. to 140° C.

8. The curable resin composition according to claim 6, wherein the active ester resin (A) has a carbonyloxy structure in a proportion of 180 to 400 g/eq.

9. A cured product produced by curing the curable resin composition according to claim 6.

10. A semiconductor encapsulating material comprising a thermosetting resin composition containing an inorganic filler (C) in a proportion of 70% to 95% by mass in the composition in addition to the active ester resin (A) and the epoxy resin (B) of the curable resin composition according to claim 6.

11. A pre-preg produced by impregnating a reinforcement substrate with the curable resin composition according to claim 6, the curable resin composition being diluted with an organic solvent, and semi-curing the resulting impregnated substrate.

12. A circuit board produced by diluting the curable resin composition according to claim 6 with an organic solvent to prepare a varnish, shaping the varnish into a plate, and molding the plate and a copper foil under heat and pressure.

13. A build-up film produced by applying the curable resin composition according to claim 6 to a base film and drying the film, the curable resin composition being diluted with an organic solvent.

14. A cured product produced by curing the curable resin composition according to claim 7.

15. A cured product produced by curing the curable resin composition according to claim 8.

16. A semiconductor encapsulating material comprising a thermosetting resin composition containing an inorganic filler (C) in a proportion of 70% to 95% by mass in the composition in addition to the active ester resin (A) and the epoxy resin (B) of the curable resin composition according to claim 7.

17. A semiconductor encapsulating material comprising a thermosetting resin composition containing an inorganic filler (C) in a proportion of 70% to 95% by mass in the composition in addition to the active ester resin (A) and the epoxy resin (B) of the curable resin composition according to claim 8.

18. A pre-preg produced by impregnating a reinforcement substrate with the curable resin composition according to claim 7, the curable resin composition being diluted with an organic solvent, and semi-curing the resulting impregnated substrate.

19. A pre-preg produced by impregnating a reinforcement substrate with the curable resin composition according to claim 8, the curable resin composition being diluted with an organic solvent, and semi-curing the resulting impregnated substrate.

20. A circuit board produced by diluting the curable resin composition according to claim 7 with an organic solvent to prepare a varnish, shaping the varnish into a plate, and molding the plate and a copper foil under heat and pressure.

21. A circuit board produced by diluting the curable resin composition according to claim 8 with an organic solvent to prepare a varnish, shaping the varnish into a plate, and molding the plate and a copper foil under heat and pressure.

22. A build-up film produced by applying the curable resin composition according to claim 7 to a base film and drying the film, the curable resin composition being diluted with an organic solvent.

23. A build-up film produced by applying the curable resin composition according to claim 8 to a base film and drying the film, the curable resin composition being diluted with an organic solvent.

* * * * *